(12) United States Patent
Stuhlsatz et al.

(10) Patent No.: US 8,755,193 B2
(45) Date of Patent: Jun. 17, 2014

(54) METHOD AND SYSTEM FOR PROVIDING A CUSTOMIZED STORAGE CONTAINER

(75) Inventors: Jason M. Stuhlsatz, Dacula, GA (US); Mohamad El-Batal, Westminster, CO (US); Macen Shinsato, Wichita, KS (US)

(73) Assignee: Netapp, Inc., Sunnyvale, CA (US)

( * ) Notice: Subject to any disclaimer, the term of this patent is extended or adjusted under 35 U.S.C. 154(b) by 175 days.

(21) Appl. No.: 12/577,500

(22) Filed: Oct. 12, 2009

(65) Prior Publication Data

US 2011/0083992 A1   Apr. 14, 2011

(51) Int. Cl.
*H05K 5/00* (2006.01)
*H05K 7/20* (2006.01)
*H05K 7/14* (2006.01)

(52) U.S. Cl.
USPC ........... 361/752; 361/688; 361/692; 361/724; 361/797

(58) Field of Classification Search
USPC ................. 361/724, 752, 756, 800, 797, 801, 361/679.33, 679.49, 727–730, 688, 692, 361/785, 788; 206/706
See application file for complete search history.

(56) References Cited

U.S. PATENT DOCUMENTS

| | | | |
|---|---|---|---|
| 3,258,649 A * | 6/1966 | Arguin et al. | 361/807 |
| 4,327,835 A * | 5/1982 | Leger | 211/41.17 |
| 4,903,170 A * | 2/1990 | Finney et al. | 361/818 |
| 5,147,041 A * | 9/1992 | Lemieux et al. | 206/449 |
| 5,452,362 A * | 9/1995 | Burward-Hoy | 381/71.5 |
| 6,671,178 B2 * | 12/2003 | Boyer et al. | 361/724 |
| 6,697,258 B1 * | 2/2004 | Muhlfeld et al. | 361/729 |
| 6,987,674 B2 | 1/2006 | El-Batal et al. | |
| 7,042,717 B2 * | 5/2006 | El-Batal et al. | 361/679.33 |
| 7,145,770 B1 * | 12/2006 | Zimlin et al. | 361/679.33 |
| 7,194,578 B2 | 3/2007 | McKean et al. | |
| 7,304,855 B1 * | 12/2007 | Milligan et al. | 361/724 |
| 7,359,186 B2 * | 4/2008 | Honda et al. | 361/679.33 |
| 7,471,512 B1 * | 12/2008 | Strickland | 361/679.41 |
| 7,505,264 B2 | 3/2009 | Hall et al. | |
| 2003/0100198 A1 * | 5/2003 | Hicks et al. | 439/65 |
| 2005/0057909 A1 * | 3/2005 | El-Batal et al. | 361/796 |
| 2005/0215107 A1 * | 9/2005 | Castello et al. | 439/378 |
| 2006/0140179 A1 * | 6/2006 | Campini et al. | 370/360 |
| 2007/0247804 A1 * | 10/2007 | Li et al. | 361/687 |
| 2008/0174948 A1 * | 7/2008 | Davis | 361/684 |
| 2009/0016010 A1 * | 1/2009 | Vinson et al. | 361/684 |

OTHER PUBLICATIONS

Storage Bridge Bay Working Group, Inc., Storage Bridge Bay (SBB) Specification, Version 2.0, Jan. 28, 2008, pp. 1-155.

* cited by examiner

*Primary Examiner* — Jeremy C Norris
*Assistant Examiner* — Sherman Ng
(74) *Attorney, Agent, or Firm* — Haynes and Boone, LLP

(57) ABSTRACT

A method and system for providing a customized storage container includes a generally rectangular housing and at least one printed circuit board contained within the rectangular housing. The customized storage container encloses a first row of interconnector modules that are positioned adjacent to a first, open end of the rectangular housing. The customized storage container also encloses a second row of interconnector modules positioned adjacent to the first, open end of the rectangular housing. At least one air vent is positioned along a side of the rectangular housing and adjacent to a second, closed end of the rectangular housing. According to one exemplary embodiment, the storage container can comprise a single printed circuit board for supporting the first and second row of interconnector modules. In another exemplary embodiment, the storage container can comprise two printed circuit boards for supporting the first and second rows interconnector modules.

20 Claims, 10 Drawing Sheets

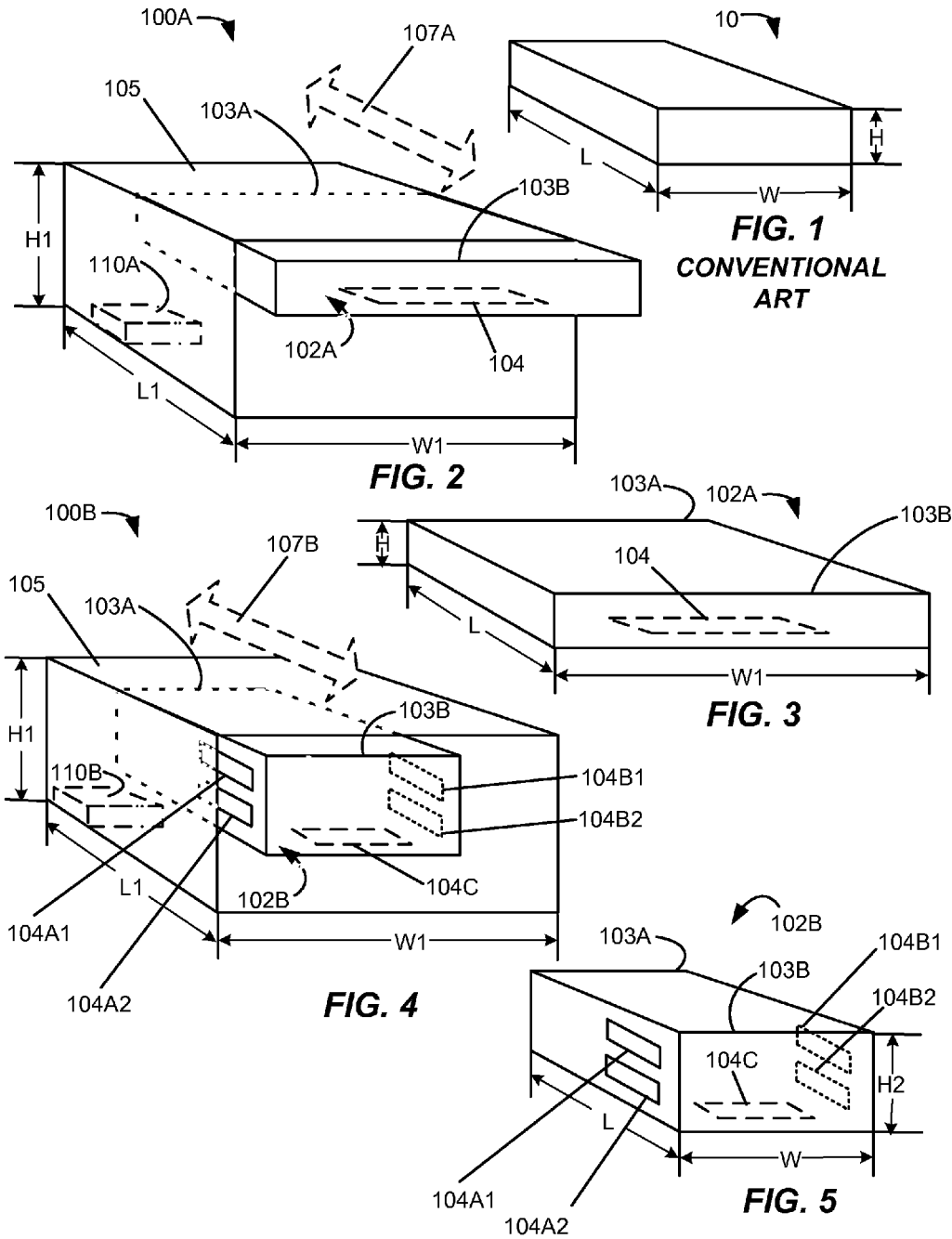

METHOD AND SYSTEM FOR PROVIDING A CUSTOMIZED STORAGE CONTAINER

FIELD OF THE INVENTION

The invention generally relates to storage containers for housing electronics. More particularly, the invention relates to storage canisters for enclosing electronics that mate with enclosures having specifications governed by one or more standards.

BACKGROUND

The Storage Bridge Bay (SBB) specification is a standard for storage solution providers who desire to have a standard controller and slot compatibility between respective controllers which can be manufactured by different organizations. The SBB specification describes the physical requirements for storage canisters 10 (See FIG. 1) and the mid-plane connectors of a storage enclosure (not shown). The storage enclosure can envelope or house one or more storage canisters 10. Meanwhile, each storage canister 10 houses a printed circuit board having electronics mounted thereon. A current version of the SBB specification, as of this writing, is Storage Bridge Bay Specification, Version 2.0 released Jan. 28, 2008, the entire contents of which are hereby incorporated by reference.

Referring briefly to FIG. 1, this Figure illustrates a conventional storage canister 10 that houses a printed circuit board (not illustrated in this Figure) and corresponding electronics on the printed circuit board. The conventional storage canister 10 has a length dimension L, a width dimension W, and a height dimension H which are dictated by the SBB Specification Version 2.0. Specifically, the width dimension W can comprise a magnitude of 209.55 mm while the height dimension H can comprise a magnitude of 38.1 mm. The length dimension L can comprise a magnitude of 289.05 mm. While there are certain advantages in keeping the dimensions of the conventional storage canister 10 constant, there can be disadvantages when a user desires to provide uniquely shaped and customized printed circuit boards (PCBs) within the storage canister 10.

For example, if a larger printed circuit board is desired to be used with a particular storage enclosure, then this cannot be done because the conventional storage canister 10 has a fixed size. As a further example, if two or more printed circuit boards which are coupled together are desired to be coupled to a storage enclosure, then the conventional storage canister 10 cannot be utilized because of its limited, smaller dimensions that are incapable of housing more than one printed circuit board (PCB) which have at least width and length dimensions greater than or equal to that of the conventional storage canister 10.

Even if a conventional storage canister 10 could house or enclose a larger printed circuit board or multiple print circuit boards, the conventional storage canister 10 would likely not be equipped to handle the increased heat generation due to the additional electronics which would be present within the conventional storage canister 10.

Accordingly, there is a need in the art for a method and system for providing customized storage containers that can house or enclose larger PCBs or multiple PCBs that can be coupled to a single storage enclosure. There is a further need in the art for providing customized storage containers that can adhere to the standards of the mid-plane connectors for storage enclosures in which the mid-plane connectors are designed to receive standard sized storage containers.

SUMMARY

A storage container comprises a generally rectangular housing having a length dimension, a width dimension, and a height dimension. The length and width dimensions are substantially greater than the height dimension. The storage container further has at least one printed circuit board contained within the rectangular housing. A first row of interconnector modules is positioned adjacent to a first, open end of the rectangular housing and positioned on the at least one printed circuit board. A second row of interconnector modules is positioned adjacent to the first, open end of the rectangular housing. And at least one air vent is positioned along a side of the rectangular housing and adjacent to a second, closed end of the rectangular housing.

According to another exemplary embodiment, a system for storing electronics comprises a storage enclosure for receiving and enclosing at least one storage container. The storage container comprises a generally rectangular housing having a length dimension, a width dimension, and a height dimension. The length and width dimensions are substantially greater than the height dimension. At least one printed circuit board is contained within the rectangular housing. A first row of interconnector modules is positioned adjacent to a first, open end of the rectangular housing and positioned on the at least one printed circuit board. A second row of interconnector modules is positioned adjacent to the first, open end of the rectangular housing. And at least one air vent is positioned along a side of the rectangular housing and adjacent to a second, closed end of the rectangular housing.

According to another exemplary aspect, a method for forming a storage system, comprises forming at least one printed circuit board and forming a first row of interconnector modules on the at least one printed circuit board. A second row of interconnector modules can be formed. A generally rectangular housing is made out of a rigid material having a length dimension, a width dimension, and a height dimension. The length and width dimensions are substantially greater than the height dimension. At least one air vent is formed and positioned along a side of the rectangular housing and adjacent to a closed end of the rectangular housing. The at least one printed circuit board is inserted within the housing. The first row of interconnector modules can be positioned adjacent to an open end of the rectangular housing. The second row of interconnector modules can be positioned within the rectangular housing and adjacent to the open end of the rectangular housing.

BRIEF DESCRIPTION OF THE DRAWINGS

FIG. 1 illustrates a perspective view of a conventional storage canister.

FIG. 2 illustrates a system that includes a storage enclosure that receives a customized storage container that houses an enlarged printed circuit board according to an exemplary embodiment of the invention.

FIG. 3 is a perspective view of the customized storage container of FIG. 2 that houses the enlarged printed circuit board according to an exemplary embodiment of the invention.

FIG. 4 illustrates a perspective view of another system that includes a storage enclosure that receives a customized storage container that houses multiple printed circuit boards according to an exemplary embodiment of the invention.

FIG. 5 is a perspective view of the customized storage container of FIG. 4 that houses multiple printed circuit boards according to an exemplary embodiment of the invention.

DETAILED DESCRIPTION

Figure 6:
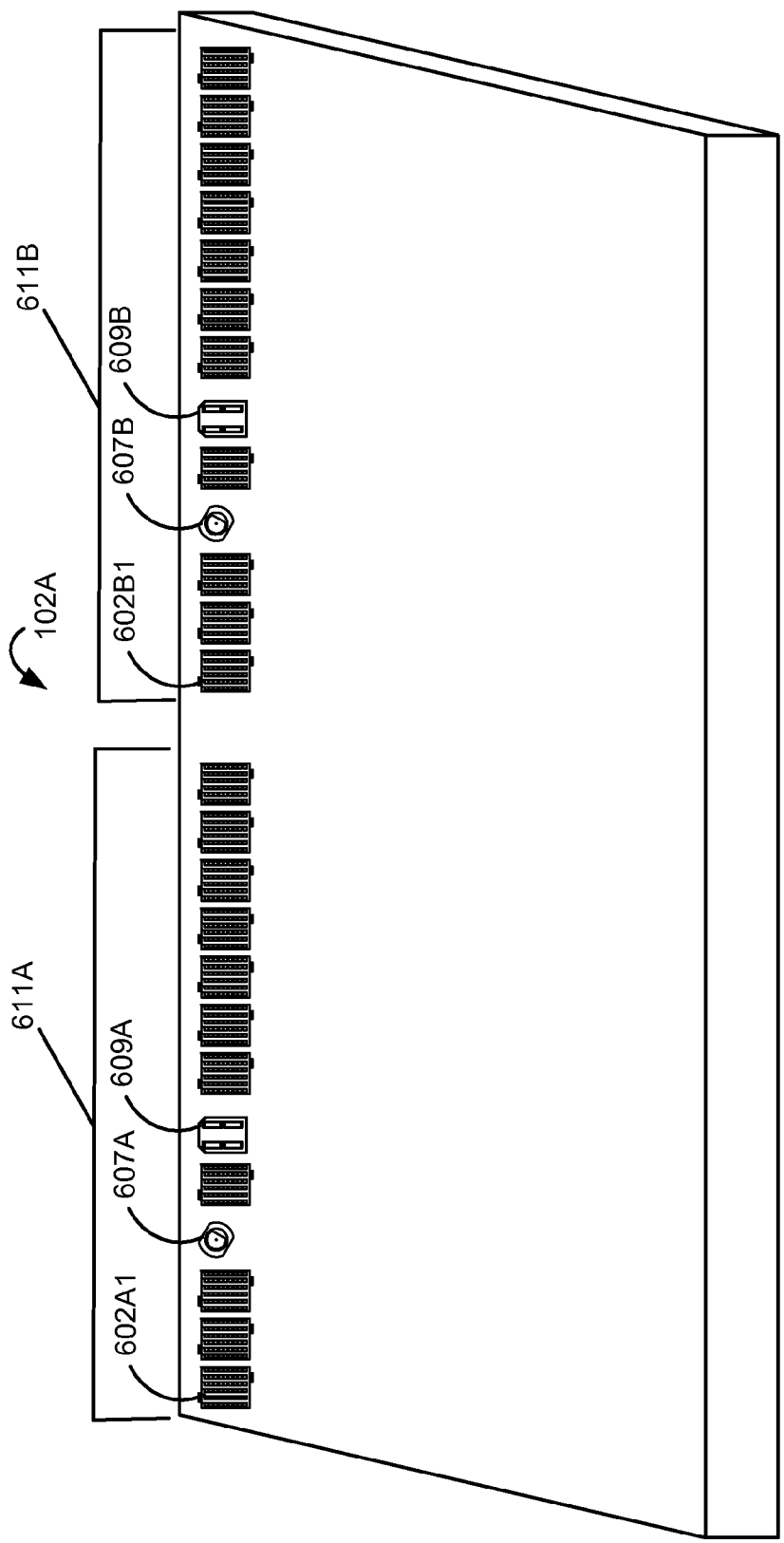
FIG. 6 is perspective view of the customized storage container of FIG. 3 that houses the enlarged printed circuit board and which further illustrates details of mid-plane interconnect modules according to an exemplary embodiment of the invention.

Referring now to the drawings, in which like reference numerals denote like elements, FIG. 2 illustrates a system 100A that includes a storage enclosure 105 that receives a customized storage container 102A that houses an enlarged printed circuit board 1302 (not shown in FIG. 2, but see FIG. 13) according to an exemplary embodiment of the invention. The storage enclosure 105 can have a height dimension H1, a length dimension L1, and a width dimension W1. These dimensions are proportioned such that the storage enclosure 105 can receive at least one customized storage container 102A.

Figure 8:
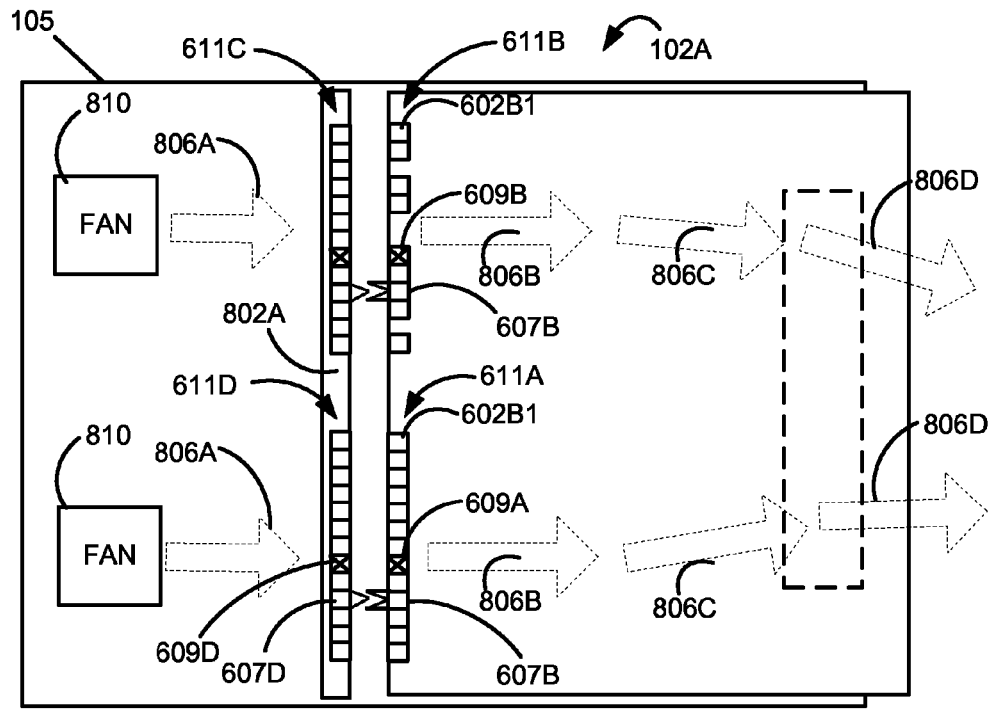
FIG. 8 is a top view that illustrates exemplary air-flow for heat removal in the storage enclosure of FIG. 2 having a mid-plane connector with two sets of interconnect modules which couple with the interconnect modules of the customized storage container having an enlarged printed circuit board according to an exemplary embodiment of the invention.

The storage enclosure 105 can also contain one or more disk drives 110A that are electrically coupled to the mid-plane connector 802 (See FIG. 8 for the interconnector 802). The one or more disk drives 110 can comprise a redundant array of independent disks (RAIDs). Alternatively, disk drives 110 can comprise a just bunch of disks (JBOD), a RAID'ed Bunch of Disks (RBOD), or an Application Bunch of Disks (ABOD) that are used for applications such as for a storage computer server.

The one or more disk drives 110 have been illustrated with a rectangular box without regard to specific dimensions or proportions relative to the storage enclosure 105 or customized storage containers 102A, B. Meanwhile, the dimensions of the storage enclosure 105 and the customized storage containers 102A, B have been drawn with relative proportions under consideration. That is, the storage enclosure 105 and the storage containers 102A, B have been illustrated proportionately relative to one another.

The customized storage container 102A of FIG. 2 can comprise a single vent 104 in a side as defined by the container's length (L) and width (W1) dimensions that that can allow a cooling medium or heat-transfer fluid, such as air, to propagate out of the storage container 102A. The cooling medium usually must be able to flow from a first end 103A of the container 102A towards a second end 103B and out through the vent 104 as required by the Storage Bridge Bay Specification, Version 2.0 released Jan. 28, 2008, the entire contents of which are hereby incorporated by reference.

The customized storage container 102A can be made from various types of materials or a single material. Such materials can include, but are not limited to, metals, polymers, ceramics, glasses, and composites. According to one exemplary embodiment, the customized storage container 102A can be made from metal, such as pre-coated steel. Specifically, the customized storage container 102A can be formed out of sheet steel that is either pre-plated with electro-galvanic zinc or hot dipped zinc.

As required by the Storage Bridge Bay Specification, Version 2.0 released Jan. 28, 2008 (the entire contents of which are hereby incorporated by reference), the surfaces of the customized storage container 102A that contact the storage enclosure 105 as well as any electromagnetic interference (EMI) and electrostatic discharge (ESD) contact surfaces like the guide rails, an ejector, and an EMI gasket (not illustrated), usually must be corrosion free and galvanically compatible to zinc finishes, including any EMI gasket material chosen for the storage container 102A. The conductivity of the contact surfaces usually must not exceed 1 milli-Ohms.

The storage container 102A can be inserted into the storage enclosure 105 as well as removed from the storage enclosure 105 along the direction noted with arrow 107A. Like the storage container 102A, the storage enclosure 105 can be made from various types of materials or a single material. Such materials can include, but are not limited to, metals, polymers, ceramics, glasses, and composites. The storage enclosure 105 may have a width dimension W1 that is at least twice the width dimension W (2×W) of the conventional canister 10 of FIG. 1. However, the storage enclosure 105 may have a width dimension W1 which is greater than or less than twice the width dimension W of the conventional canister 10 according to other exemplary embodiments.

FIG. 3 is a perspective view of the customized storage container 102A of FIG. 2 that houses an enlarged printed circuit board according to an exemplary embodiment of the invention. The customized storage container 102A can comprise a height dimension H, a length dimension L, and a width dimension that is approximately equal to the width dimension W1 of the storage enclosure 105. This means that the width dimension W1 of the customized storage container 102A can be approximately equal to twice the width dimension W of the conventional canister 10 illustrated in FIG. 1. The width dimension W1 comprises a magnitude of approximately 429.1 millimeters. However, other magnitudes greater than or less than this dimension are within the scope of the invention.

The height dimension H of the customized storage container 102A can have a height dimension H which is substantially equal to the height dimension H of the conventional canister 10 of FIG. 1. Similarly, the length dimension L of the customized storage container 102A can have a magnitude that is substantially equal to the length dimension L of the conventional canister 10 of FIG. 1.

FIG. 4 illustrates another system 100B that includes a storage enclosure 105 that receives a customized storage container 102B that houses multiple printed circuit boards 1502A, 1502B (not shown in FIG. 4, but see FIG. 15) according to an exemplary embodiment of the invention. The system 100B shares many elements which are also found in FIG. 2 described above. Accordingly, such shared elements having like reference numerals in FIG. 4 will not be described in any further detail in connection with this Figure.

The customized storage container 102B comprises at least four vents 104A1, 104B1, 104A2, 104B2 that are used to allow the cooling medium to flow therethrough. Alternatively, or in addition to the four vents 104A1, 104B1, 104A2, 104B2, the customized storage container can comprise a fifth vent 103C that is positioned in a side defined by the length (L) and width (W) dimensions. The customized storage container 102B of FIG. 4 can also be inserted into the storage enclosure 105 as well as removed from the storage enclosure 105 along the directional arrow 107B. The storage enclosure 105 can have similar dimensions to the storage enclosure 105 of FIG. 2.

FIG. 5 is a perspective view of the customized storage container 102B of FIG. 4 that houses multiple printed circuit boards 1502A, 1502B (not shown in FIG. 4, but See FIG. 15) according to an exemplary embodiment of the invention. This means that the height dimension H2 of the customized storage container 102B can be approximately equal to twice the height dimension H of the conventional canister 10 illustrated in FIG. 1. The height dimension H2 comprises a magnitude of approximately 77.8 millimeters. However, other magnitudes greater than or less than this dimension are within the scope of the invention.

As noted previously, the customized storage container 102B can comprise at least two sets of two rectangular shaped air vents 104A1, 104A2, 104B1, and 104B2 as well as a lower vent 104C defined by a side having the length (L) and width (W) dimensions. The air vents 104 are generally positioned closer to a second end 103B of the customized storage container 102B relative to a first end 103A. This position of the air vents 104 relative to the first and second ends 103A, 103B is consistent across the two exemplary embodiments illustrated in FIGS. 2-5.

The air vents 104 can have a length dimension with a magnitude of approximately 43.7 mm and a width dimension with a magnitude of approximately 25.4 mm. For the customized storage container 102B of FIG. 3, the air vents 104 can be extended along their length dimension.

However, other magnitudes for the dimensions of the air vents 104 greater than or less than those disclosed are entirely within the scope of the invention. Further, the invention is not limited to rectangular shaped air vents 104. Other shapes such as circular, oval/elliptical, square, pentagonal, and octagonal shapes are within the scope of the invention. The dimensions and shapes of the air vents 104 are also consistent across the two exemplary embodiments illustrated in FIGS. 2-5.

FIG. 6 is perspective view of the customized storage container 102A of FIG. 3 that houses the enlarged printed circuit board (not shown) and which further illustrates details of mid-plane interconnect modules 602 according to an exemplary embodiment of the invention. The mid-plane interconnect modules 602 are governed by the Storage Bridge Bay Specification, Version 2.0 released Jan. 28, 2008 (the entire contents of which are hereby incorporated by reference). This means the maximum number, type, and position/placement of the interconnect modules 602, guide modules 607, and power modules 609 are governed by the standard.

The interconnect modules 602 generally comprise electrical connectors for supporting signal flow to and from connectors positioned on a mid-plane connector 802. A guide module 607A can be disposed between the interconnect modules 602. The guide module 607A can comprise a mechanical connector that can help align the interconnect modules 602 of a mid-plane connector 802 with interconnect modules 602 of the customized storage container 102A. A power module 609A can also be positioned between certain interconnect modules 602. The power module 609A can support electrical power signals to and from the enlarged printed circuit board 1302. In this Figure, the vents 104 have not been illustrated but are present as understood by one of ordinary skill in the art.

While two full sets 611A, 611B of interconnect modules 602 having respective guide modules 607 and power modules 609 are illustrated, the invention can comprise at least one full set 611A of interconnect modules 602 and at least a partial set 611B of interconnect modules 607 in which the number of interconnect modules 602 is reduced. However, in this case of a partial set of interconnect modules 607, the second guide module 607B is usually retained to help with the mechanical alignment of the customized storage container 102A. This means that the second power module 609B and several or all the secondary interconnect modules 607B, relative to the primary interconnect modules 607A, can be dropped without departing from the scope of the invention. Examples of these partial sets of interconnect module 607 are further illustrated in FIGS. 13 and 15. Utilizing less than all of the second set 611B of interconnect modules 607B allows for the design of very customized printed circuit boards.

Figure 7:
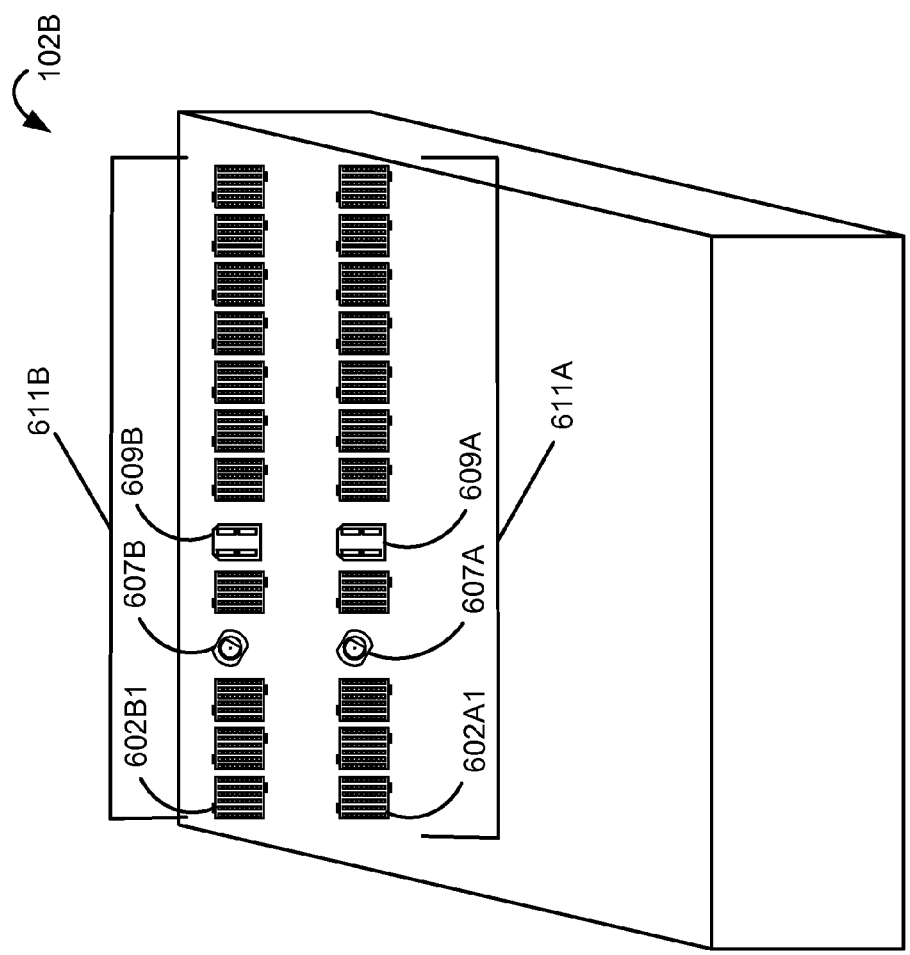
FIG. 7 is perspective view of the customized storage container of FIG. 5 that houses multiple circuit boards and which further illustrates details of mid-plane interconnect modules according to an exemplary embodiment of the invention.

FIG. 7 is perspective view of the customized storage container 102B of FIG. 5 that houses multiple circuit boards and which further illustrates details of mid-plane interconnect modules 602 according to an exemplary embodiment of the invention. FIG. 7 shares several elements which are similar to those found in FIG. 6. Therefore, only the differences between the elements of FIG. 6 will be described relative to FIG. 7. Also, in this Figure, the vents 104 have not been illustrated but are present as understood by one of ordinary skill in the art.

In FIG. 7, the two sets 611A, 611B of mid-plane interconnect modules 602 are stacked upon one another. Similar to FIG. 6, the invention can comprise at least one full set 611A of interconnect modules 602 and at least a partial set 611B of interconnect modules 607 in which the number of interconnect modules 602 is reduced. However, in this case of a partial set of interconnect modules 607, the second guide module 607B is usually retained to help with the mechanical alignment of the customized storage container 102A. This means that the second power module 609B and several or all the secondary interconnect modules 607B, relative to the primary interconnect modules 607A, can be dropped without departing from the scope of the invention.

FIG. 8 is a top view that illustrates exemplary air-flow for heat removal in the storage enclosure 105 of FIG. 2 having a mid-plane connector 802A with two sets of interconnect modules 611C, 611D which couple with the interconnect modules 611A, 611B of the customized storage container 102A having an enlarged printed circuit board (not illustrated in this Figure). In this Figure, the interconnect modules 611 are represented by square boxes. Meanwhile, details of the physical attributes of the interconnect modules 611 have been illustrated in FIGS. 6 and 7 as discussed above. Similarly, the guide modules 607 have been represented with simple geometrical convex and concave shapes in order to illustrate the male/female physical attributes of these mechanical connectors.

The customized storage container 102A of FIG. 8 has been illustrated as partially inserted into the storage enclosure 105. One of ordinary skill in the art recognizes that the respective interconnect modules 611, guide modules 607, and power modules 609 mate with one another when the storage container 102A is fully inserted into the storage enclosure 105. Directional arrows 806 illustrate an exemplary flow of air across the mid-plane connector 802B which originates from inside the enclosure 105 and into and then out of the customized storage container 102A.

A cooling medium movement device, such as a fan 810, can move air that follows directional arrows 806A-806D from inside the storage enclosure 105 across the mid-plane connector 802B and into and then out of the customized storage container 102A through the single vent 104. While two fans 810 have been illustrated in FIG. 8, a single fan 810 or a plurality of fans 810 can be employed without departing from the scope of the invention.

Figure 9:
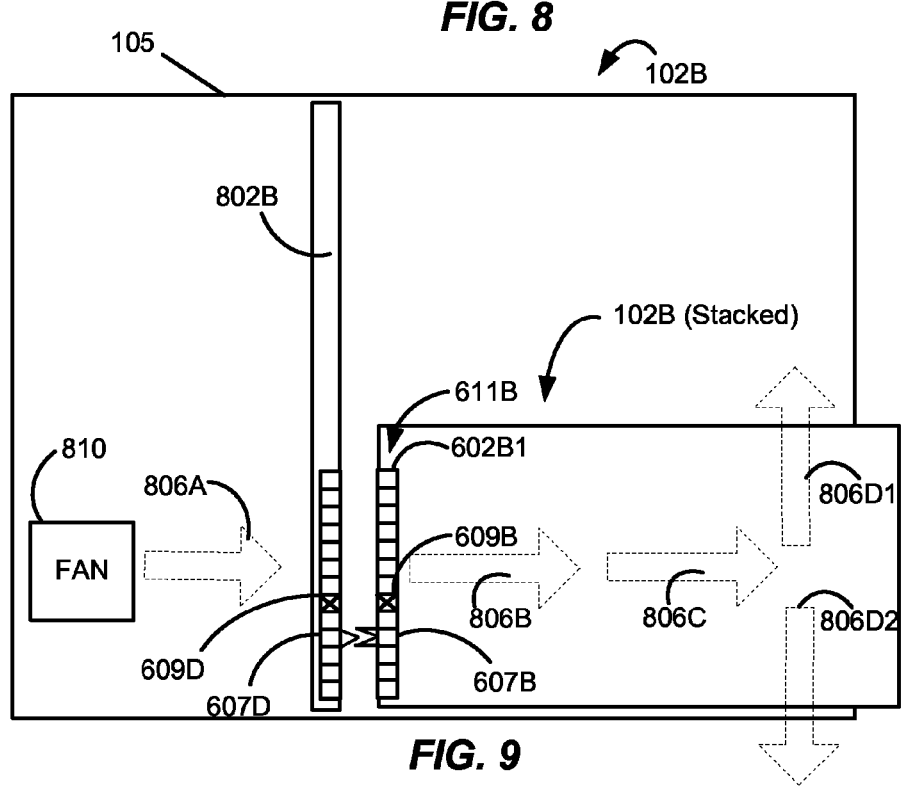
FIG. 9 is a top view that illustrates exemplary air-flow for heat removal in the storage enclosure of FIG. 4 having a mid-plane connector with two sets of interconnect modules which couple with the interconnect modules of the customized storage container having stacked, multiple printed circuit boards according to an exemplary embodiment of the invention.

FIG. 9 is a top view that illustrates exemplary air-flow for heat removal in the storage enclosure 105 of FIG. 4 having a mid-plane connector 802B with two sets of interconnect modules 611C,D which couple with two sets of interconnect modules 611A,B of the customized storage container 102B. In this exemplary embodiment, the fifth, lower vent 104C defined by the length (L) and width (W) dimensions is not present.

The customized storage container 102B has stacked, multiple printed circuit boards 1502A,B according to an exemplary embodiment of the invention. FIG. 9 shares several elements which are similar to those found in FIG. 8. Therefore, only the differences between the elements of FIG. 9 will be described relative to FIG. 8.

In this Figure, since the height dimension H2 is projected into the page, only a single row of interconnect modules 611 can be seen for the mid-plane connector 802B and the customized storage container 102B. This means that both the mid-plane connector 802B and the customized storage container 102B are positioned in a stacked relationship such that only a first row of interconnect modules 611 are visible in this Figure. As noted above, while not illustrated in FIG. 8, the second row of interconnect modules 611 of both the mid-plane connector 802 and the customized storage container 102B may provide a reduced number of interconnect modules 611 relative to the first row. See FIG. 15.

Similar to FIG. 8, a fan 810 is illustrated in FIG. 9 and that produces the airflow that originates from the storage enclosure 105 and is propagated into the customized storage container 102B and out of the air vents 104 near the second end 103B of the customized storage container 102B. While only one customized storage container 102B is illustrated in FIG. 9, one of ordinary skill in the art recognizes that a second customized storage container 102B (not illustrated) could be provided within the storage enclosure 105 adjacent to the one illustrated. As noted previously, the storage enclosure 105 can be sized appropriately to house as many customized storage containers 102A, B that may be desired for a particular application.

Figure 10:
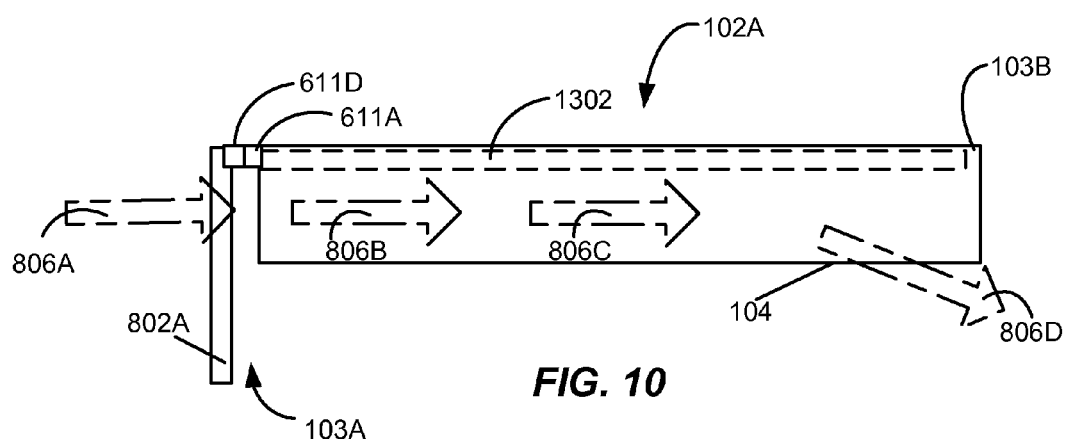
FIG. 10 is a side view that illustrates air-flow through the customized storage container having an enlarged printed circuit board according to an exemplary embodiment of the invention.

FIG. 10 is a side view that illustrates air-flow through the customized storage container 102A having an enlarged printed circuit board 1302 according to an exemplary embodiment of the invention. Air as indicated by directional arrow 806A is propagated through holes (not shown) within the mid-plane connector 802A and through the first end 103A of the storage container 102A which is open. The air continues through the storage container 102A as indicated by directional arrows 806B,C. The air exits the storage container 102A at the single air vent 104 which is positioned in a side of the storage container 102A defined by the length dimension (L) and width dimension (W1) and adjacent to a closed end 103B of the storage container 102A. While only one vent 104 has been illustrated with respect to this embodiment, additional vents could be added in the side defined by the length dimension (L) and width dimension (W1) without departing from the scope of the invention.

Figure 11:
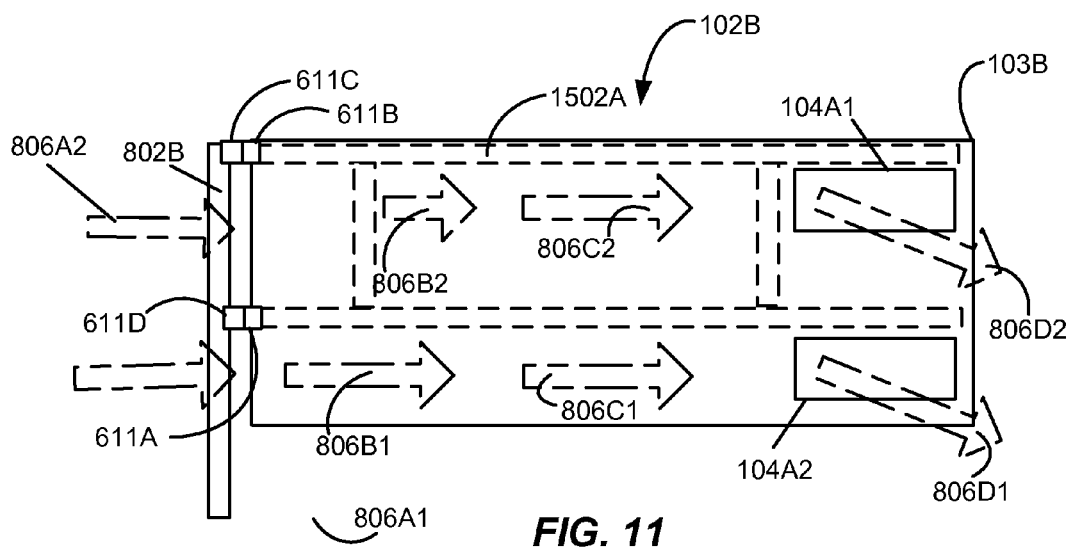
FIG. 11 is a side view that illustrates air-flow through the customized storage container having multiple, stacked printed circuit boards according to an exemplary embodiment of the invention.

FIG. 11 is a side view that illustrates air-flow through the customized storage container 102B having multiple, stacked printed circuit boards 1502A, 1502B according to an exemplary embodiment of the invention. As noted previously, for this particular exemplary embodiment, the fifth air vent 104C is not present in the side defined by the length dimension (L) and width dimension (W).

The air-flow of FIG. 11 is similar to that of FIG. 10. However, there will be at least two flows of air that propagate through the storage container 102B because of the two channels formed by the respective printed circuit boards 1502A,B which are positioned in a stacked, parallel relationship. Each flow of air in this exemplary embodiment will exit through a respective air vent 104.

Figure 12:
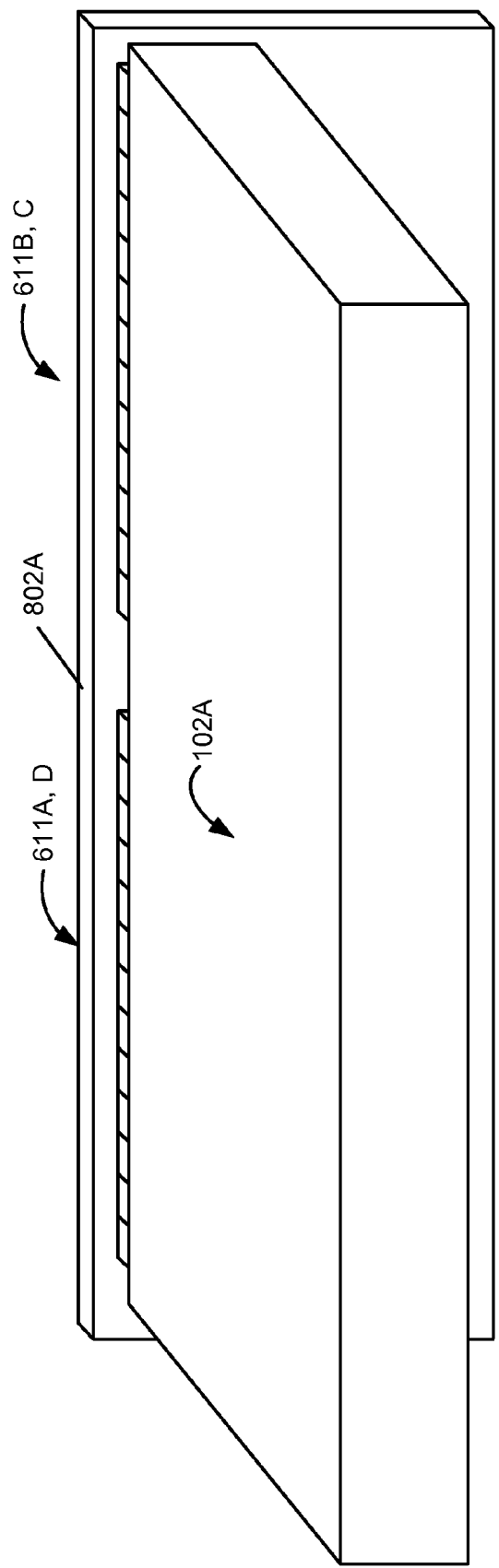
FIG. 12 is a perspective view of the customized storage container having an enlarged printed circuit board coupled to the mid-plane connector according to an exemplary embodiment of the invention.

FIG. 12 is a perspective view of the customized storage container 102A having an enlarged printed circuit board (not illustrated) coupled to the mid-plane connector 802A according to an exemplary embodiment of the invention. The rows 611A-D of interconnector modules 602 have been illustrated with single, rectangular boxes to indicate that the rows 611A, B of the storage container 102A have mated with the rows 611C, D of the mid-plane connector 802A. Further, while the secondary rows 611B, 611C have been illustrated with a complete set of interconnector modules 602, as discussed above, a fewer number of interconnector modules 602 may be provided in the secondary row 611B relative to the primary row 611A of interconnector modules 602 positioned on the printed circuit board 1302 within the storage container 102A.

Similarly, a fewer number of interconnector modules 602 may be provided in the secondary row 611C relative to the primary row 611D of the interconnector modules 602 positioned on the mid-plane connector 802A. Also, it is possible to provide a smaller set or row of interconnector modules 602 on a printed circuit board 1302 which mate with a complete set or row of interconnector modules 602 on the mid-plane connector 802A.

Figure 13:
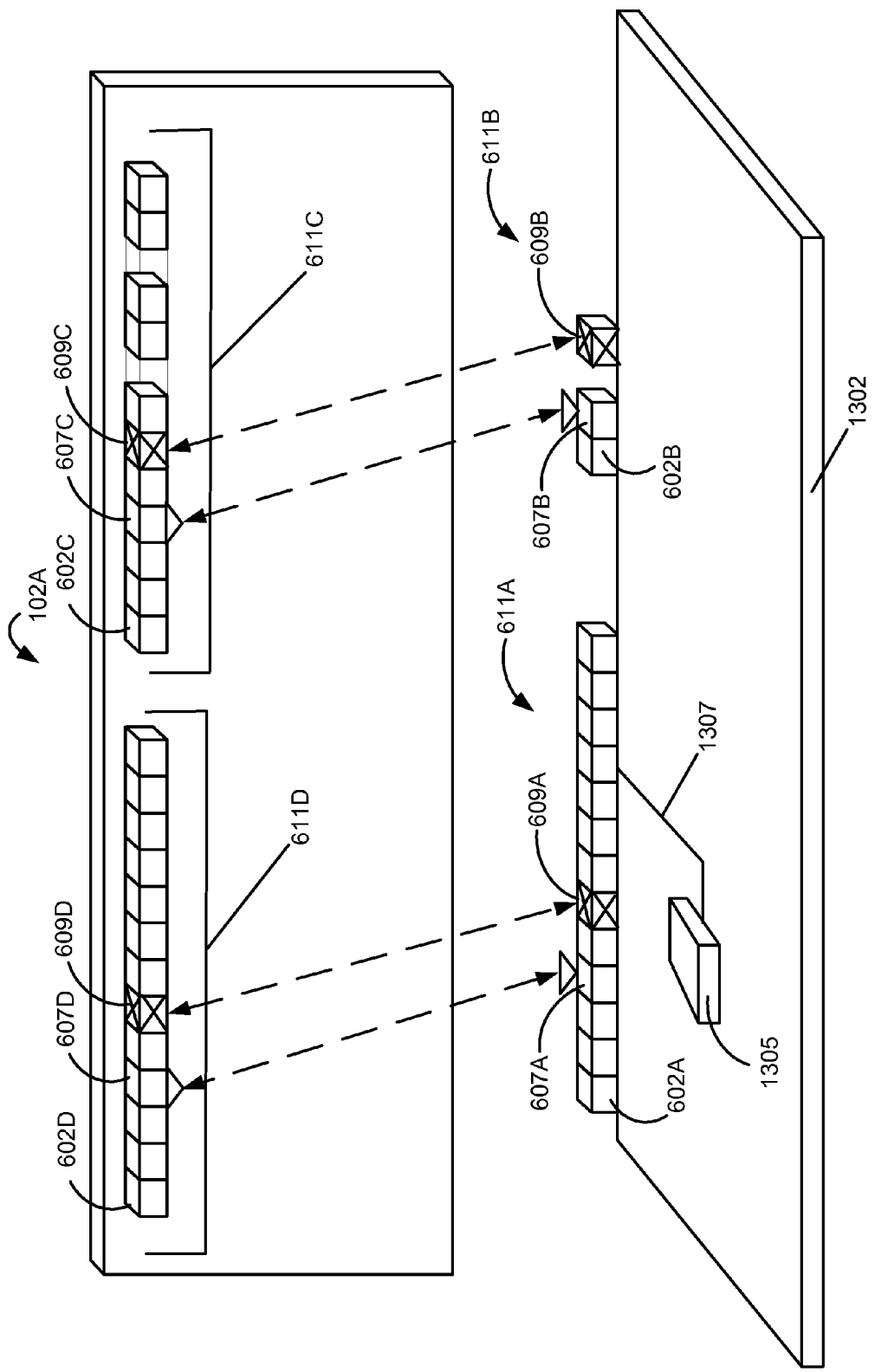
FIG. 13 is a perspective view of the enlarged printed circuit board and how it is coupled to the mid-plane connector according to an exemplary embodiment of the invention.

FIG. 13 is a perspective view of the enlarged printed circuit board 1302 and how it is coupled to the mid-plane connector 802A according to an exemplary embodiment of the invention. In this exemplary embodiment, the printed circuit board 1302 supports two rows 611A,B of interconnector modules 602. The first or primary row 611A has a complete set of interconnector modules 602 as well as a guide module 607A and a power module 609A. Meanwhile, the second or secondary row 611B has a reduced set of interconnector modules 602B relative to the first or primary row 611A.

The secondary row 611B can also comprise a guide module 607C and the power module 609B. It is noted that the guide modules 607A,C of the printed circuit board 1302 have been illustrated with inverted triangles, while the guide modules 607C, D of the mid-plane connector 802A have been illustrated with non-inverted triangles to denote the male/female mating relationship between the respective guide modules 607 of FIG. 13.

Further, the secondary row 611C of the mid-plane connector 802A has been illustrated with an incomplete set of interconnector modules 602C relative to the primary row 611D of interconnector modules 602. As discussed above, the secondary row 611C of the mid-plane connector 802A may also comprise a complete set of interconnector modules 602C. Also, there does not need to be a 1:1 correspondence or ratio between the respective rows 611B,C of the mid-plane connector 802A and the printed circuit board 1302. As illustrated in FIG. 13, the secondary row 611B of the printed circuit board 1302 has fewer interconnector modules 602B relative to all of the rows 611 illustrated in FIG. 13.

Meanwhile, the secondary row 611C of the mid-plane connector 802A may have fewer interconnector modules 602C relative to the primary rows 611A, D and it may have more interconnector modules 602C relative to the secondary row 611B of the printed circuit board 1302. Other combinations with respect to the number of interconnector modules 602 are within the scope of the invention. Generally, the rows 611C, 611D of the mid-plane connector 802A will have a greater number of interconnector modules 602 relative to the rows 611A, B of the printed circuit board 1302 in order to insure that the electronics of the printed circuit board 1302 are electrically coupled to the mid-plane connector 802A.

FIG. 13 also illustrates a die or electronic chip 1305 that is supported by the printed circuit board 1302. The electronic chip 1305 can be coupled to one of the interconnector modules 602A by a conductive trace 1307. Additional electronic chips 1305 and other printed circuits can be positioned on the circuit board 1302 and coupled to respective interconnector modules 602A,B.

Figure 14:
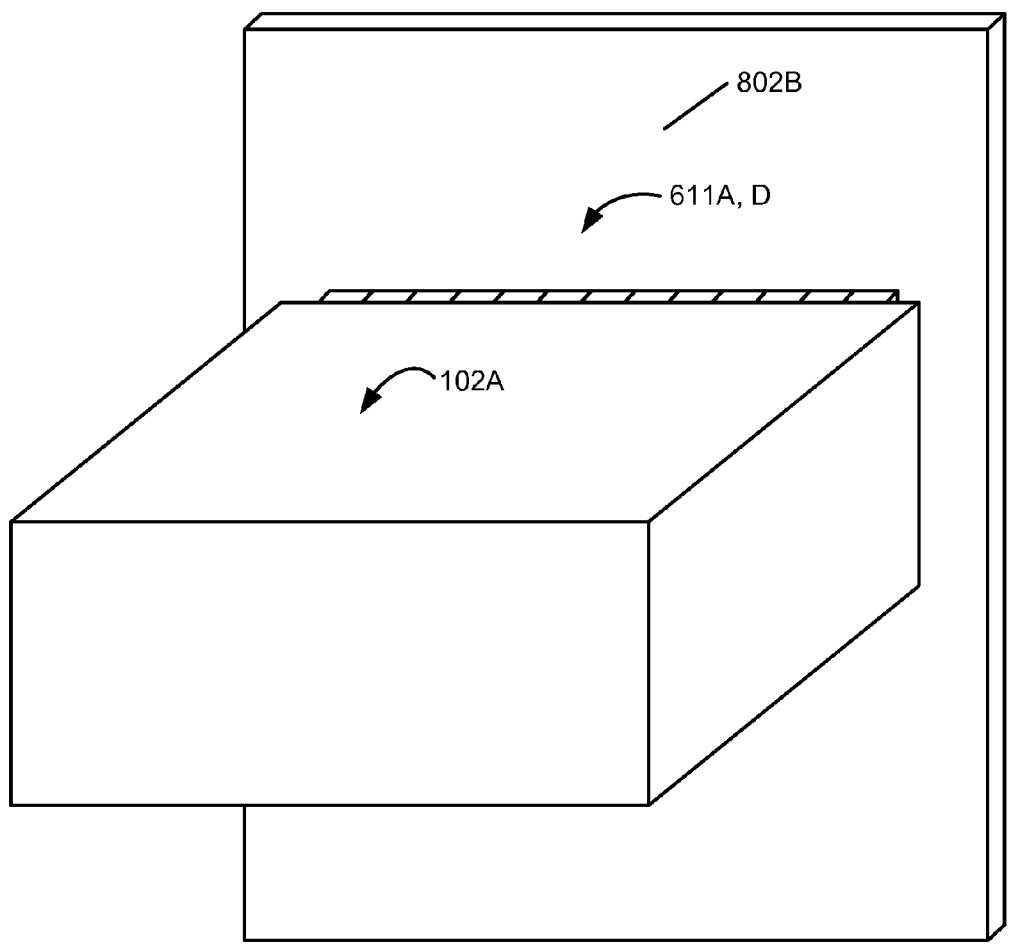
FIG. 14 is a perspective view of the customized storage container having multiple, stacked printed circuit boards coupled to the mid-plane connector according to an exemplary embodiment of the invention.

FIG. 14 is a perspective view of the customized storage container 102B having multiple, stacked printed circuit boards (not illustrated) coupled to the mid-plane connector 802B according to an exemplary embodiment of the invention. Similar to FIG. 12, the rows 611A-D of interconnector modules 602 have been illustrated with single, rectangular boxes to indicate that the rows 611A, B of the storage container 102B have mated with the rows 611C, D of the mid-plane connector 802B. In this exemplary embodiment, the mid-plane connector 802B supports two rows 611C, 611D of interconnector modules 602 which are positioned parallel to one another. In this Figure, only a top row 611D of interconnector modules 602 is visible.

Figure 15:
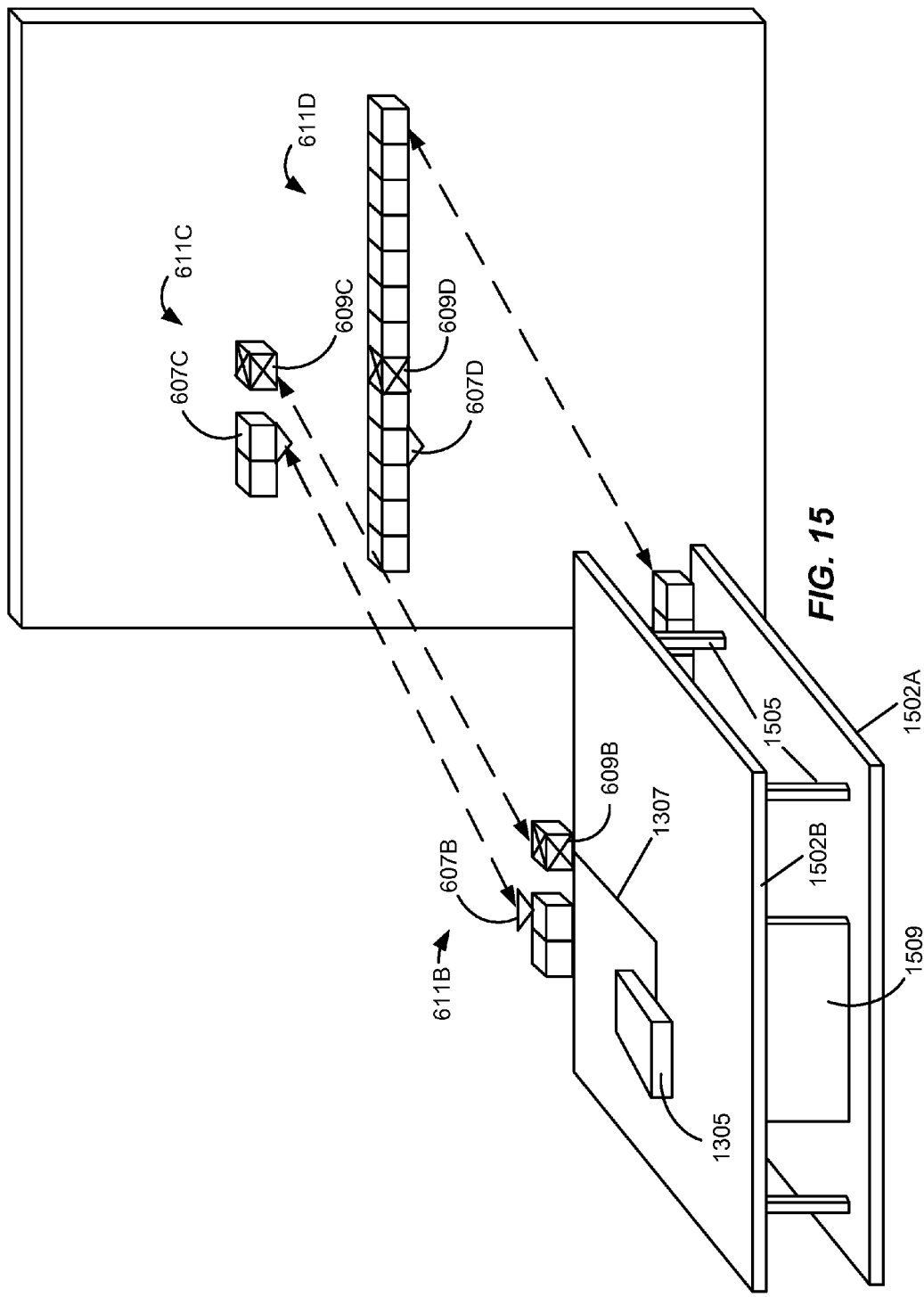
FIG. 15 is a perspective view of the multiple, stacked printed circuit boards and how they are coupled to the mid-plane connector according to an exemplary embodiment of the invention.

FIG. 15 is a perspective view of the multiple, stacked printed circuit boards 1502A,B and how they are coupled to the mid-plane connector 802B according to an exemplary embodiment of the invention. FIG. 15 is similar to FIG. 13. Therefore, only the differences between these two figures will be described below. The first printed circuit board 1502A may be separated and spaced from the second printed circuit board 1502B by using one or more mechanical supports 1505. The first printed circuit board 1502A may be electrically coupled to the second printed circuit board 1502B by a board-to-board connector 1509. However it is possible that in some cases that the board-to-board connector 1509 is not used.

Figure 16:
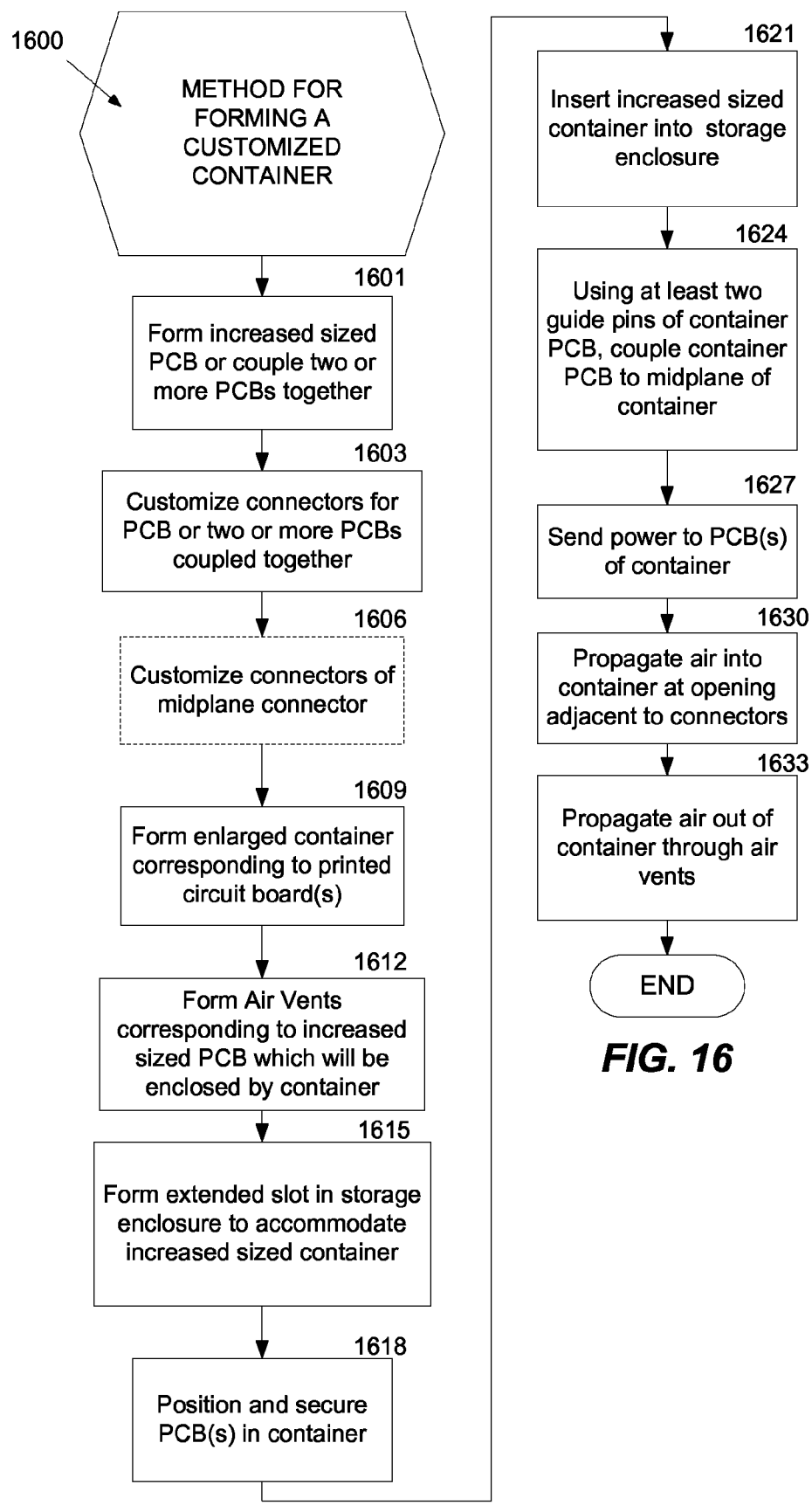
FIG. 16 is a logic flow diagram highlighting various steps of a method for forming and using a customized container according to an exemplary embodiment of the invention.

FIG. 16 is a logic flow diagram highlighting various steps of a method for forming and using a customized container 102 according to an exemplary embodiment of the invention.

Certain steps in the processes or process flow described in this specification must naturally precede others for the invention to function as described. However, the invention is not limited to the order of the steps described if such order or sequence does not alter the functionality of the invention. That is, it is recognized that some steps may performed before, after, or parallel other steps without departing from the scope and spirit of the invention. In some instances, certain steps can be deleted or not performed without departing from the invention.

Referring now to FIG. 16, step 1601 is the first step of the method 1600 in which an increased sized printed circuit board 1302 or a plurality of printed circuit boards 1502A, 1502B are formed. The increased sized printed circuit board 1302 of FIG. 13 can be formed with a width dimension which is generally twice the size of the widths of the containers required by the Storage Bridge Bay Specification, Version 2.0 released Jan. 28, 2008, the entire contents of which are hereby incorporated by reference. Alternatively, the dual printed circuit boards 1502A, 1502B of FIG. 15 can be formed such that their length and width dimensions generally correspond with the length and width dimensions of the containers required by the Storage Bridge Bay Specification, Version 2.0 released Jan. 28, 2008. In this step, the dual printed circuit boards 1502A,B can be coupled to one another by using one or more supports 1505.

Next, in step 1603, the interconnector modules 602 for the printed circuit boards 1302 and 1502A,B can be customized. Generally, a single enlarged printed circuit board 1302 will support at least two rows 611A,B of interconnector modules 602 that are positioned along a single geometrical line. Alternatively, for printed circuit boards 1502A,B provided in a stacked relationship as illustrated in FIG. 15, each row 611A,B is provided on a respective printed circuit board 1502.

Each row 611A,B can be provided with a number of interconnector modules 602 that correspond with those required by the Storage Bridge Bay Specification, Version 2.0 released Jan. 28, 2008, the entire contents of which are hereby incorporated by reference. Alternatively, each row 611A, B can be provided with fewer interconnector modules 602 than are required by the Storage Bridge Bay Specification. According to one exemplary embodiment, at least one row 611A has a complete set of interconnector modules 602 while another row 611B has less than a complete set relative to the Storage Bridge Bay Specification.

Generally, according to an exemplary embodiment, both rows 611A,B will be provided with at least one guide module 607 and at least one power module 609. However, other embodiments in which at least one guide module 607 and at least one power module 609 are not present in a respective row 611 are included within the scope of the invention.

Next, in optional step 1606 illustrated with dashed lines, the interconnector modules 602 of the mid-plane connector 802 can be customized such that the interconnector modules 602 correspond with the interconnector modules 602 selected for the one or more printed circuit boards 1302, 1502A,B. This means that the number of interconnector modules 602 selected for the mid-plane connector 802 is usually equal to the number selected for the interconnector modules 602 of the printed circuit boards 1302, 1502A,B.

In step 1609, a customized, enlarged storage container 102 is formed from a rigid material, such as a metal, polymer, ceramics, glasses, and/or composites. According to one exemplary embodiment, the customized storage container 102 can be made from metal, such as pre-coated steel. Specifically, the customized storage container 102 can be formed out of the sheet steel that is either pre-plated with electro galvanic zinc or hot dipped zinc. In this step, the various sides of the generally rectangular housing 102 are formed. The rectangular housing 102 is usually formed with one side completely missing to allow for the insertion of a printed circuit board 1302 or a plurality of printed circuit boards 1502A,B into the rectangular housing 102. The rectangular housing 102 is formed with dimensions that correspond to the dimensions of the printed circuit boards 1302, 1502A, 1502B.

In step 1612, air vents 104 are formed in the container 102. Single or dual vents 104 are formed depending upon the number of printed circuit boards 1302, 1502A,B housed within the container 102.

Next, in step 1615, extended sized slots may be formed within the storage enclosure 105 in order to accommodate an increased sized container 102 relative to the sizes of containers dictated by the Storage Bridge Bay Specification. In step 1618, the one or more printed circuit boards 1302, 1502A,B are positioned and secured within the storage container 102. Various fastening or securing techniques can be used to secure the one or more printed circuit boards 1302, 1502A,B to the storage container 102. Such that techniques can include, but are not limited to, using mechanical fasteners such as screws and rivets in addition to soldering and spot welds.

In step 1621, the customized and increased sized container 102 can be inserted into a slot of the storage enclosure 105. In step 1624, using at least two guide modules or pins 607, the interconnector modules 602 of the one or more printed circuit boards 1302, 1502A,B can be coupled to the mid-plane connector 802. In this step, additional and various locking and keying mechanisms can be used to secure the storage container 102 within the enclosure 105 as called out by the Storage Bridge Bay Specification, the contents of which are hereby incorporated by reference.

In step 1627, electrical power to the printed circuit boards 1302, 1502A,B can be received through the one or more power modules 609. In step 1630, air can be propagated into the container 102 starting at the opening adjacent to the interconnector modules 602. In step 1633, the air can be propagated out of the container 102 through the one or more air vents 104. The process 1600 then ends.

Alternative embodiments for the method 1600 and system 102 for method for forming and using a customized container 102 will become apparent to one of ordinary skill in the art to which the invention pertains without departing from its spirit and scope. For example, while only two rows 611A,B of interconnector modules 602 have been described, the invention may also include additional embodiments that have three or four rows 611 of interconnector modules 602. Thus, although this invention has been described in exemplary form with a certain degree of particularity, it should be understood that the present disclosure is made only by way of example and that numerous changes in the details of construction and the combination and arrangement of parts or steps may be resorted to without departing from the scope or spirit of the invention.

What is claimed is:

1. A storage container capable of being inserted into a storage enclosure, the storage container comprising:
    a generally rectangular housing having a length dimension, a width dimension, and a height dimension, the length and width dimensions being substantially greater than the height dimension;
    at least one printed circuit board contained within the rectangular housing, the printed circuit board having a side with a largest surface area parallel to a side with a largest surface area of the rectangular housing;
    a first row of interconnector modules positioned adjacent to a first, open end of the rectangular housing and positioned on the edge of the at least one printed circuit board, the first row of interconnector modules being accessible and configured to mate with a connector of the storage enclosure through the first, open end of the rectangular housing;
    a second row of interconnector modules positioned adjacent to the first, open end of the rectangular housing; and
    at least one air vent positioned along a side of the rectangular housing and adjacent to a second, closed end of the rectangular housing.

2. The storage container of claim 1, wherein the at least one printed circuit board supports both the first and second rows of interconnector modules along the first, open end of the rectangular housing, the first and second rows of interconnector modules positioned along a single geometrical line.

3. The storage container of claim 1, wherein the at least one printed circuit board is a first printed circuit board, the storage container further comprising a second printed circuit board, the second printed circuit board supporting the second row of interconnector modules.

4. The storage container of claim 3, wherein the first and second printed circuit boards are positioned in a stacked relationship.

5. The storage container of claim 1, wherein the second row of interconnector modules comprises fewer interconnector modules relative to first row of interconnector modules.

6. The storage container of claim 2, wherein the second row of interconnector modules comprises fewer interconnector modules relative to first row of interconnector modules.

7. The storage container of claim 3, wherein the second row of interconnector modules comprises fewer interconnector modules relative to first row of interconnector modules.

8. The storage container of claim 1, further comprising a guide module positioned within each row of interconnector modules.

9. The storage container of claim 5, further comprising a guide module positioned within each row of interconnector modules.

10. The storage container of claim 1, further comprising at least one power module positioned within at least one row of the interconnector modules.

11. A system for storing electronics comprising:
    a storage enclosure for receiving and enclosing at least one storage container;
    the storage container comprising:
        a generally rectangular housing having a length dimension, a width dimension, and a height dimension, the length and width dimensions being substantially greater than the height dimension;
        at least one printed circuit board contained within the rectangular housing, the printed circuit board having a side with a largest surface area parallel to a side with a largest surface area of the rectangular housing;
        a first row of interconnector modules positioned adjacent to a first, open end of the rectangular housing and positioned on the edge of the at least one printed circuit board, the first row of interconnector modules being accessible and configured to mate with a connector of the storage enclosure through the first, open end of the rectangular housing;
        a second row of interconnector modules positioned adjacent to the first, open end of the rectangular housing; and at least one exhaust air vent positioned along a bottom side of the rectangular housing and adjacent to a second, closed end of the rectangular housing,
wherein the storage enclosure includes a fan operable to move air from the first, open end of the rectangular housing, to the at least one exhaust air vent.

12. The system of claim 11, wherein the storage enclosure comprises a mid-plane connector that comprises third and fourth rows of interconnector modules which mate with the first and second rows of interconnector modules positioned adjacent to a first, open end of the rectangular housing.

13. The system of claim 12, wherein the fourth row of interconnector modules comprises fewer interconnector modules relative to the third row of interconnector modules.

14. The system of claim 12, wherein the fourth row and the third row of interconnector modules are positioned along a single geometrical line on the mid-plane connector.

15. The system of claim 12, wherein the fourth row and the third row of interconnector modules are positioned along two geometrical lines that are parallel to one another on the mid-plane connector.

16. A method for forming a storage system, comprising:
forming at least one printed circuit board;
forming a first row of interconnector modules on the at least one printed circuit board;
forming a second row of interconnector modules;
forming a generally rectangular housing out of a rigid material having a length dimension, a width dimension, and a height dimension, the length and width dimensions being substantially greater than the height dimension, the generally rectangular housing being capable of being inserted into a storage enclosure;
forming at least one air vent positioned along a side of the rectangular housing and adjacent to a closed end of the rectangular housing;
inserting the at least one printed circuit board within the housing, the at least one printed circuit board being inserted such a side with a largest surface area of the printed circuit board is parallel to a side with a largest surface area of the rectangular housing;
positioning the first row of interconnector modules adjacent to an open end of the rectangular housing, such that the first row of interconnector modules is accessible and configured to mate with a connector of the storage enclosure through the open end of the rectangular housing, the first row of interconnector modules being positioned on the edge of the at least one printed circuit board; and
positioning the second row of interconnector modules within the rectangular housing and adjacent to the open end of the rectangular housing.

17. The method of claim 16, wherein forming the second row of interconnector modules further comprises positioning the second row of interconnector modules and the first row of interconnector modules along a single geometric line and on the at least one printed circuit board.

18. The method of claim 16, wherein forming the second row of interconnector modules further comprises positioning the second row of interconnector modules and the first row of interconnector modules along two separate geometrical lines.

19. The method of claim 18, wherein the at least one printed circuit board comprises a first printed circuit board, the method further comprising positioning the second row of interconnector modules on a second printed circuit board.

20. The method of claim 16, wherein forming the second row of interconnector modules further comprises forming the second row of interconnector modules with fewer modules relative to the first row of interconnector modules.

* * * * *